(12) United States Patent
Ding et al.

(10) Patent No.: US 10,892,222 B1
(45) Date of Patent: Jan. 12, 2021

(54) ANTI-FUSE FOR AN INTEGRATED CIRCUIT (IC) PRODUCT AND METHOD OF MAKING SUCH AN ANTI-FUSE FOR AN IC PRODUCT

(71) Applicant: GLOBALFOUNDRIES Inc., Grand Cayman (KY)

(72) Inventors: Erfeng Ding, Clifton Park, NY (US); Guoxiang Ning, Clifton Park, NY (US); Meixiong Zhao, Ballston Lake, NY (US)

(73) Assignee: GLOBALFOUNDRIES Inc., Grand Cayman ( * ) Notice: Subject to any disclaimer, the term of this patent is extended or adjusted under 35 U.S.C. 154(b) by 0 days.

(21) Appl. No.: 16/560,591

(22) Filed: Sep. 4, 2019

(51) Int. Cl.
| | |
|---|---|
| *H01L 23/52* | (2006.01) |
| *H01L 23/525* | (2006.01) |
| *H01L 27/085* | (2006.01) |
| *H01L 23/528* | (2006.01) |
| *H01L 23/522* | (2006.01) |

(52) U.S. Cl.
CPC ...... *H01L 23/5252* (2013.01); *H01L 23/5226* (2013.01); *H01L 23/5283* (2013.01); *H01L 27/085* (2013.01)

(58) Field of Classification Search
CPC ............. H01L 23/5252; H01L 23/5283; H01L 23/5226; H01L 27/085; H01L 27/2463; H01L 21/8229; H01L 21/8239; H01L 45/1233
See application file for complete search history.

(56) References Cited

U.S. PATENT DOCUMENTS

| | | | |
|---|---|---|---|
| 5,412,245 A | 5/1995 | Favreau | |
| 5,929,505 A * | 7/1999 | Takagi | H01L 21/76886 257/528 |
| 6,087,677 A | 7/2000 | Wu | |
| 6,465,282 B1 | 10/2002 | Tobben et al. | |
| 8,623,728 B2 * | 1/2014 | Chang | H01L 21/18 438/285 |
| 8,742,457 B2 * | 6/2014 | Yang | H01L 27/11206 257/183 |
| 8,750,069 B2 * | 6/2014 | Kim | H01L 27/10876 365/225.7 |
| 8,848,423 B2 * | 9/2014 | Chung | H01L 27/224 365/148 |
| 9,142,316 B2 * | 9/2015 | Liu | H01L 27/11206 |
| 9,165,936 B2 * | 10/2015 | Ponoth | H01L 29/66795 |
| 9,633,943 B2 * | 4/2017 | Cheng | H01L 21/76224 |

(Continued)

*Primary Examiner* — William Coleman
(74) *Attorney, Agent, or Firm* — Anthony Canale; Hoffman Warnick LLC

(57) ABSTRACT

One illustrative IC product disclosed herein includes a first conductive line positioned at a first level within the IC product and a first conductive structure positioned at a second level within the IC product, wherein the second level is lower than the first level. In this illustrative example, the IC product also includes a second conductive structure that is conductively coupled to the first conductive line, wherein at least a portion of the second conductive structure is positioned at a level that is above the first level and wherein nearest surfaces of the first conductive structure and the second conductive structure are laterally offset from one another by a lateral distance and insulating material positioned between the nearest surfaces of the first conductive structure and the second conductive structure.

20 Claims, 15 Drawing Sheets

(56) References Cited

U.S. PATENT DOCUMENTS

| | | | |
|---|---|---|---|
| 9,735,164 B2 * | 8/2017 | Zheng | H01L 29/0673 |
| 9,773,792 B1 * | 9/2017 | Liaw | G11C 17/18 |
| 9,852,982 B1 * | 12/2017 | Pei | H01L 29/66795 |
| 9,893,014 B1 * | 2/2018 | Fogel | H01L 29/66545 |
| 9,953,990 B1 * | 4/2018 | Horch | H01L 21/76224 |
| 10,008,507 B2 * | 6/2018 | Adusumilli | H01L 27/11206 |
| 10,109,740 B2 * | 10/2018 | Adusumilli | H01L 29/66795 |
| 10,229,920 B1 * | 3/2019 | Cheng | H01L 27/11273 |
| 10,573,596 B2 * | 2/2020 | Reznicek | H01L 23/62 |
| 10,714,422 B2 * | 7/2020 | Zhang | H01L 21/76886 |
| 2013/0307115 A1 | 11/2013 | Filippi et al. | |
| 2014/0346603 A1 * | 11/2014 | Toh | G11C 17/16 257/350 |
| 2019/0131238 A1 * | 5/2019 | Chang | H01L 23/5252 |
| 2019/0165045 A1 * | 5/2019 | Chung | G11C 13/0028 |
| 2019/0244933 A1 * | 8/2019 | Or-Bach | G11C 11/5628 |
| 2020/0058660 A1 * | 2/2020 | Chang | H01L 27/11206 |

* cited by examiner

US 10,892,222 B1

ANTI-FUSE FOR AN INTEGRATED CIRCUIT (IC) PRODUCT AND METHOD OF MAKING SUCH AN ANTI-FUSE FOR AN IC PRODUCT

BACKGROUND

Field of the Invention

The present disclosure generally relates to various novel embodiments of an anti-fuse for an integrated circuit (IC) product and various novel methods of making such an IC product.

Description of the Related Art

Anti-fuses are commonly employed in modern IC products. An anti-fuse is an electrical device that performs the opposite function to a fuse. An anti-fuse is activated to create a connection between two or more conductors. In one example, anti-fuses may be employed for one-time programming purposes. Anti-fuses can be employed for several purposes. For example, an anti-fuse can be used to repair DRAM arrays by swapping defective cells with redundant cells. An anti-fuse can also be used for product configuration and for updating and repairing IC products The present disclosure is generally directed to various novel embodiments of an anti-fuse for an IC product and various novel methods of making such an IC product.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is directed to various novel embodiments of an anti-fuse for an IC product and various novel methods of making such an IC product. One illustrative IC product disclosed herein includes a first conductive line positioned at a first level within the IC product and a first conductive structure positioned at a second level within the IC product, wherein the second level is lower than the first level. In this illustrative example, the IC product also includes a second conductive structure that is conductively coupled to the first conductive line, wherein at least a portion of the second conductive structure is positioned at a level that is above the first level and wherein nearest surfaces of the first conductive structure and the second conductive structure are laterally offset from one another by a lateral distance and insulating material positioned between the nearest surfaces of the first conductive structure and the second conductive structure.

Another illustrative product disclosed herein includes a semiconductor substrate, a first transistor device comprising a first conductive source/drain contact structure of a first transistor device and an M0 contact connection positioned above and conductively coupled to the first conductive source/drain contact structure, wherein the M0 contact connection is positioned at a first level within the integrated circuit product. In this illustrative example, the IC product also includes a second transistor device comprising a second conductive source/drain contact structure, wherein the second conductive source/drain contact structure is positioned at a second level within the integrated circuit product that is lower than the first level, a first conductive structure that is conductively coupled to the M0 contact connection, wherein at least a portion of the first conductive structure is positioned at a level that is above the first level and wherein nearest surfaces of the first conductive structure and the second conductive source/drain contact structure are laterally offset from one another by a lateral distance and insulating material positioned between the nearest surfaces of the M0 contact connection and the second conductive source/drain contact structure.

BRIEF DESCRIPTION OF THE DRAWINGS

The disclosure may be understood by reference to the following description taken in conjunction with the accompanying drawings, in which like reference numerals identify like elements, and in which.

Figure 1:
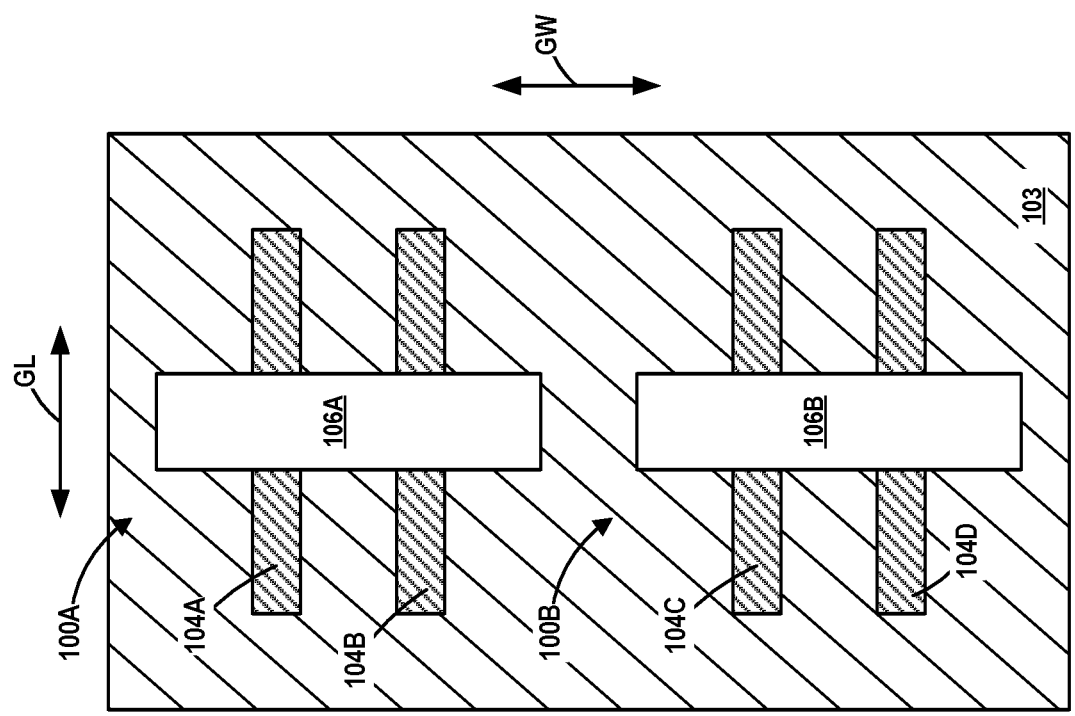
FIGS. 1-11 depict various novel embodiments of an anti-fuse for an IC product and various novel methods of making an IC product that includes such an anti-fuse.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail.

FIGS. 1-9 depict various novel embodiments of an anti-fuse for an IC product and various novel methods of making an IC product that includes such an anti-fuse. In the illustrative examples depicted herein, two illustrative transistor devices 100A, 100B (collectively referenced using the numeral 100) will be formed above a semiconductor substrate 102. As will be appreciated by those skilled in the art after a complete reading of the present application, the transistor devices 100 disclosed herein may be an N-type or a P-type device and they may be formed on a bulk semiconductor substrate or a semiconductor-on-insulator substrate. Moreover, the transistor devices 100 disclosed herein may come in a variety of different forms, e.g., a planar device, a FinFET device, etc. Additionally, the gate structure of the transistor devices 100 disclosed herein may be manufactured using known gate-first or replacement gate manufacturing techniques. For purposes of disclosure only, the transistor devices 100 described below will be FinFET devices that are formed above a bulk semiconductor substrate 102. In the examples shown herein, each of the transistor devices 100 comprises two illustrative fins 104. However, each of the transistor devices 100 may comprise any number of fins 104 (e.g., a single fin 104 or more than two fins 104) and the transistor devices 100 need not have the same number of fins 104, although that may be the case in some applications.

The various components, structures and layers of material depicted herein may be formed using a variety of different materials and by performing a variety of known process operations, e.g., chemical vapor deposition (CVD), atomic layer deposition (ALD), a thermal growth process, spin-coating techniques, etc. The thicknesses of these various layers of material may also vary depending upon the particular application. However, as noted above, the various inventions disclosed herein should not be considered to be limited to the particular example shown in the attached drawings and described below.

FIG. 1 is a simplistic plan view of the two illustrative transistor devices 100 disclosed herein at a relatively early stage of fabrication. The gate length (GL—current transport) direction of the transistors 100 as well the gate width (GW) direction of the transistor devices 100 is depicted in FIG. 1. In general, and as described more fully below, the transistor device 100A comprises two illustrative fins 104A-B and a gate 106A. The transistor device 100B comprises two illustrative fins 104C-D and a gate 106B. The fins 104A-D will be collectively referenced using the numeral 104 and the gates 106A-B will be collectively referenced using the numeral 106. The gates 106 generally comprise a gate structure (not separately shown), a gate cap (not separately shown) positioned vertically above the gate structure and at least one sidewall spacer (not separately shown) positioned at least on the sidewalls of the gate structure. The gate structure typically comprises a gate insulation layer (not separately shown), e.g., a layer of silicon dioxide, a high-k material (having a k value of at least 10) and one or more layers of conductive material (not separately shown) that function as the conductive gate electrode of the gate structure. The gate cap may be comprised of a variety of materials, e.g., silicon nitride. The at least one sidewall spacer may be comprised of a variety of materials, e.g., silicon dioxide, a low-k material, and it may be formed by performing a variety of known manufacturing techniques.

Also depicted in FIG. 1 is an illustrative and representative isolation material 103. The isolation material 103 may be comprised of a variety of materials, e.g., silicon dioxide, silicon nitride, etc., it may be comprised of one or more layers of material and it may be formed by performing a variety of known manufacturing techniques. The isolation material 103 is intended to be representative of one or more layers of insulating materials that may be formed on the IC product. Portions of the isolation material(s) 103 extend into isolation trenches 105 formed in the substrate 102 so as to electrically isolate the transistor device 100A from the transistor device 100B. Other portions of the isolation material(s) 103 are positioned above the substrate 102 in the spaces between the fins 104. The plan view in the drawings does not reflect the processing shown in the cross-sectional views depicted herein and all of the drawings in the present application are not to scale.

Figure 2:
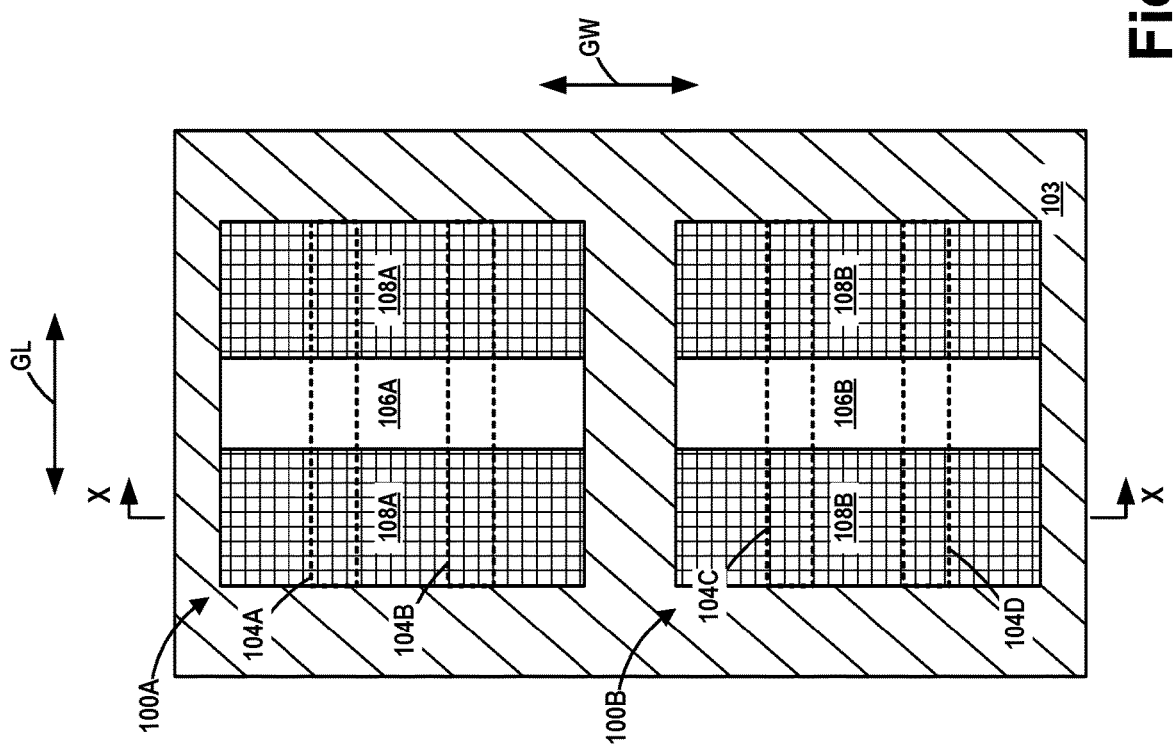

FIG. 2 depicts the IC product at a later stage of fabrication wherein illustrative conductive source/drain contact structures 108A. 108B (collectively referenced using the numeral 108) were formed so as to conductively contact the source/drain regions of the transistor devices 100A, 100B, respectively. The fins 104 are shown in dashed lines in FIG. 2 for reference purposes only. The conductive source/drain contact structures 108 may be formed by performing traditional manufacturing techniques and they may be comprised of a variety of different conductive materials, e.g., tungsten. In some embodiments, the conductive source/drain contact structures 108 may also include a metal silicide material (not separately shown), e.g., a trench silicide. In the depicted example, the conductive source/drain contact structures 108 are line-type structures that span across both source/drain regions in the gate width direction of the devices 100.

FIG. 2 depicts the location where the cross-sectional views of the transistor devices 100 (view "X-X") depicted in the later drawings in this application is taken. More specifically, the cross-sectional view X-X is taken through the axial length of conductive source/drain contact structures 108 in a direction that is parallel to the gate width direction of the transistors 100 and transverse to the long axis of the fins 104.

As noted above, in the examples depicted herein, the transistor devices 100 will be formed on and above a semiconductor substrate 102. The substrate 102 may have a variety of configurations, such as a semiconductor-on-insulator (SOI) configuration that includes a base semiconductor layer, a buried insulation layer positioned on the base semiconductor layer and an active semiconductor layer positioned above the buried insulation layer, wherein transistors that are formed on the SOI substrate are formed in and above the active semiconductor layer. Alternatively, the substrate 102 may have a simple bulk configuration. The substrate 102 may be made of silicon or it may be made of semiconductor materials other than silicon. Thus, the terms "substrate" or "semiconductor substrate" should be understood to cover all semiconducting materials and all forms of such substrates.

Figure 3:
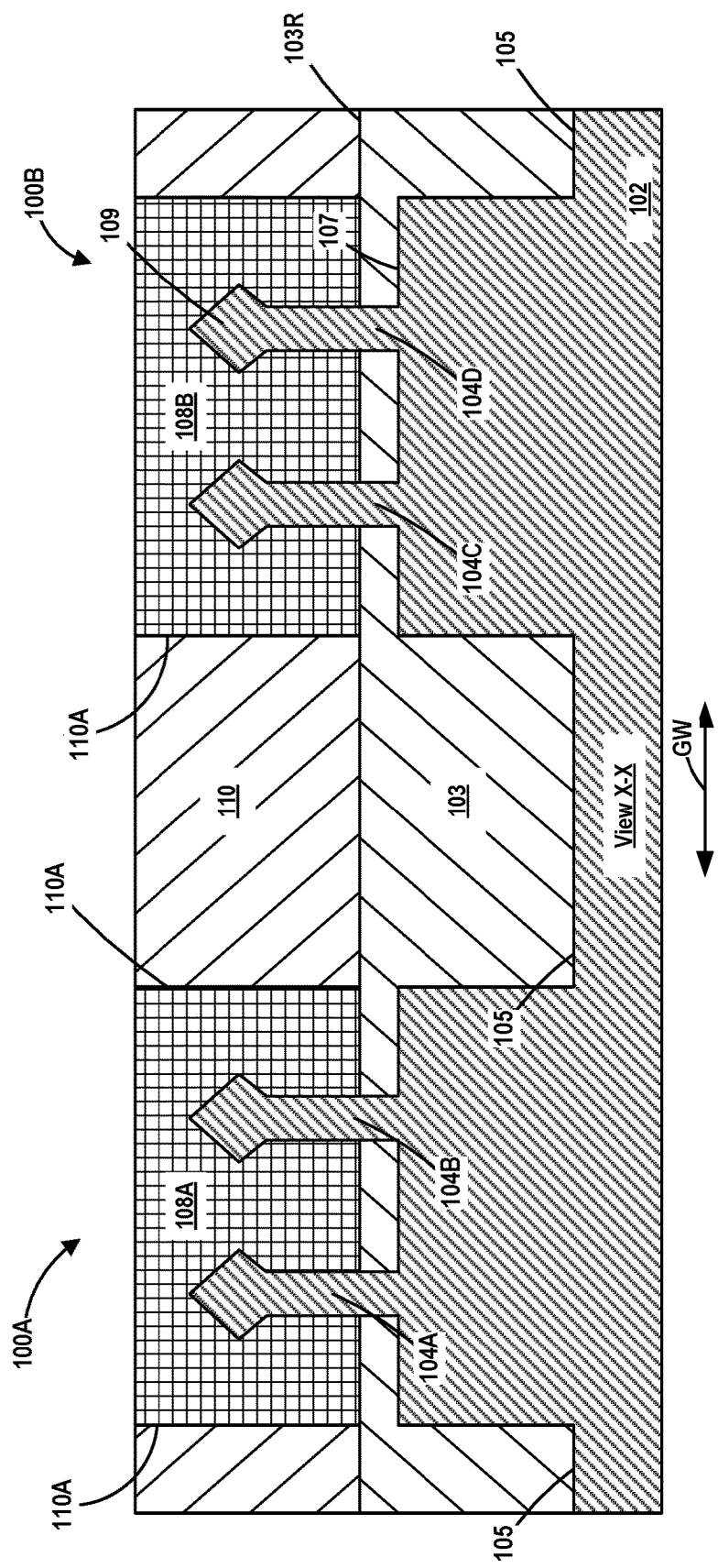

FIG. 3 depicts the transistor devices 100 at a point in fabrication after several traditional manufacturing process operations were performed to form a plurality of fin-formation trenches 107 and a plurality of fins 104 defined from the substrate material 102. With continuing reference to FIG. 3, the overall size, shape and configuration of the fin-formation trenches 107 and the fins 104 may vary depending on the particular application. The depth and width of the fin-formation trenches 107 may vary depending upon the particular application. Although the simplistically depicted fins 104 are depicted as having a substantially rectangular configuration, in a real-world device, the fins 104 may be slightly tapered, e.g., the fins 104 may be wider at the bottom of the fin than they are at the top of the fin. Thus, the size and configuration of the fin-formation trenches 107 and the fins 104, and the manner in which they are made, should not be considered a limitation of the present invention. Also depicted in FIG. 3 are illustrative isolation trenches 105 that were formed in the substrate 102 by performing known manufacturing techniques. Isolation material 103 was formed in the isolation trenches 105 and in the fin formation trenches 107 using known manufacturing techniques. As noted above, the isolation material 103 in the isolation trenches 105 serves to electrically isolate the device 100A from the device 100B. The isolation material(s) 103 may be comprised of, for example, silicon dioxide, a HARP oxide, HDP oxide, flowable oxide, etc. At some point in the process flow, a timed, recess etching process was performed on the isolation material(s) 103 such that, at the completion of the recess etching process, the isolation material(s) 103 has a substantially planar recessed upper surface 103R that is positioned at a desired height level within the fin-formation trenches 107. The amount of recessing of the isolation material(s) 103 may vary depending upon the particular application. This recess etching process exposes the desired final fin height of the fins 104 for the devices 100.

At some point later in the fabrication process, e.g., after the formation of the gates 106 (that comprises either sacrificial gate structures or final gate structures) epi semiconductor material 109 may be formed on the portions of the fins 104 in the source/drain regions of the transistor devices 100 that are not covered by the gates 106. In the depicted example, the epi semiconductor material 109 may have a substantially diamond-shaped cross-sectional configuration due to the crystallographic orientation of the substrate material from which the fins 104 are formed. However, in some applications, the epi semiconductor material may not be formed. Thereafter, additional and representative insulating material 110 was formed above the product and patterned so as to define openings 110A that expose the portions of the fins 104 (and epi material 109) in the source/drain regions of the devices 100. At that point, the above-described conductive source/drain contact structures 108 were formed in the openings 110A so as to conductively contact the source/drain regions of the devices 100. The insulating material 110 may be comprised of a variety of materials, e.g., silicon dioxide, silicon nitride, etc., it may be comprised of one or more layers of material and it may be formed by performing a variety of known manufacturing techniques. The insulating material 110 is intended to be representative of one or more layers of insulating materials that may be formed on the IC product.

Figure 4:
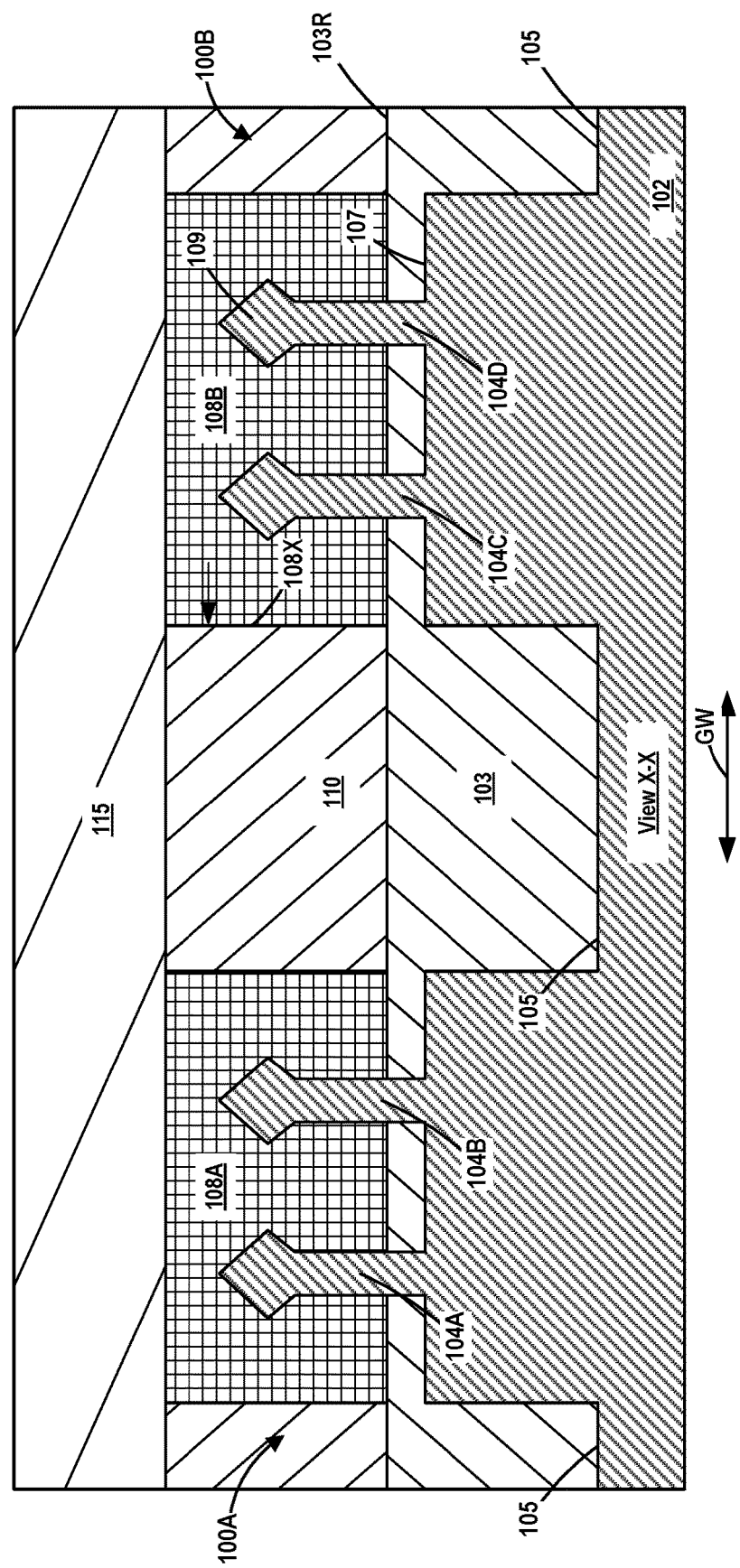

FIG. 4 depicts the transistor devices 100 after a layer of insulating material 115, e.g., silicon dioxide, was formed above the IC product.

Figure 5:
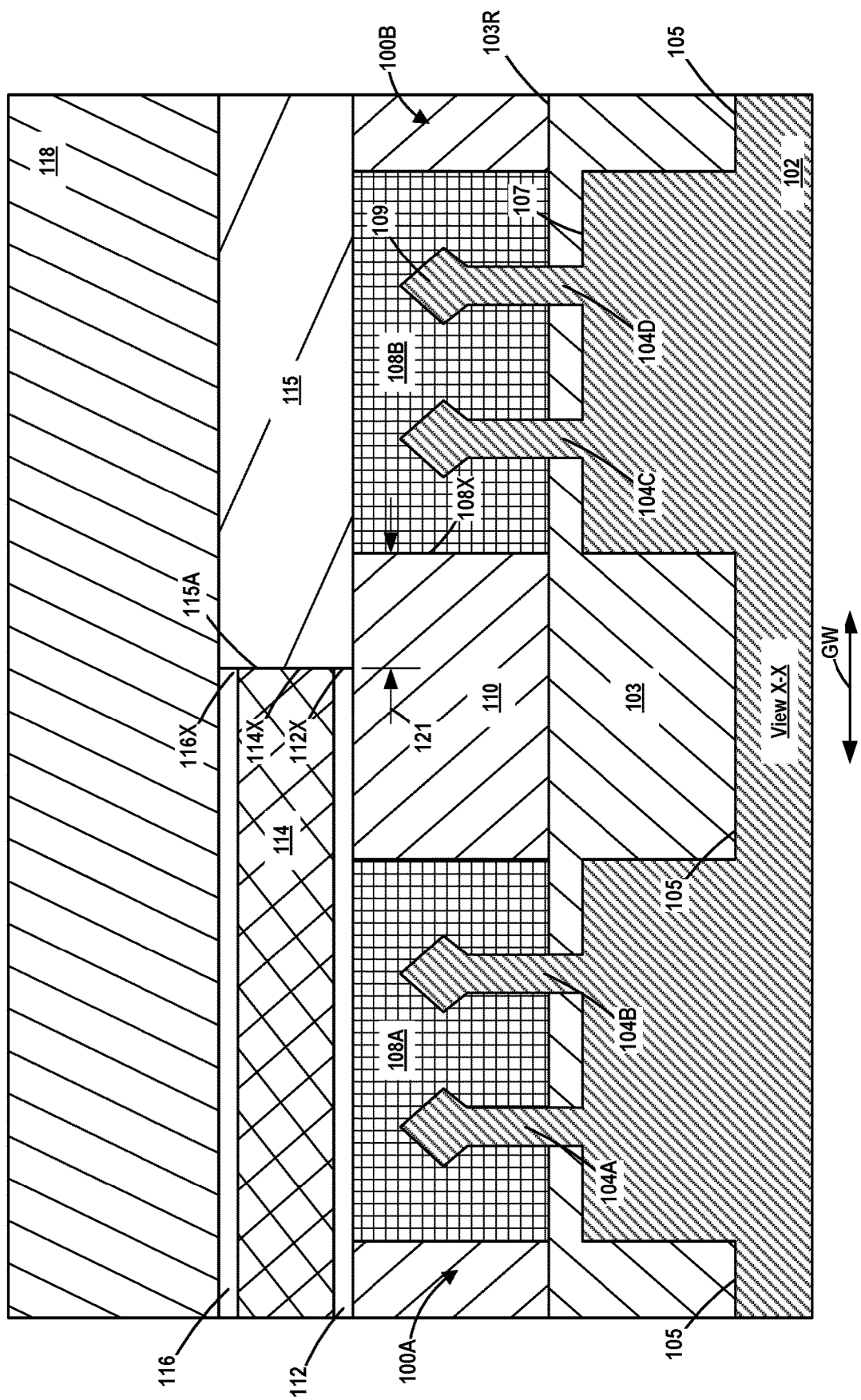

FIG. 5 depicts the IC product after several process operations were performed. In this illustrative example, the layer of insulating material 115 was patterned so as to define an opening 115A in the layer of insulating material 115. At that point, using known damascene processing techniques, a first conductive cap layer 112, a layer of conductive material 114 and a second conductive cap layer 116 was formed in the opening 115A. Note that an edge 112X of the first conductive cap layer 112, an edge 114X of the layer of conductive material 114 and an edge 116X of the second conductive cap layer 116 are substantially vertically aligned with one another and they are laterally offset from a substantially vertically oriented edge 108X of the conductive source/drain contact structure 108B by a lateral distance 121, the magnitude of which may vary depending upon the particular application. In some applications, the second conductive cap layer 116 may be omitted. The first and second conductive cap layers 112, 116 may each be comprised of one or more layers of material, e.g., Ti, TiN, etc., and they may be formed to any desired thickness. The first and second conductive cap layers 112, 116 may be made of the same conductive material, but that may not be the case in all applications. Similarly, the layer of conductive material 114 may be comprised of any conductive material, e.g., tungsten, copper, etc., and it may be formed to any desired thickness. As noted above, in the illustrative case where the layer of conductive material 114 comprises copper, it may be formed by performing known damascene processing techniques.

As will be appreciated by those skilled in the art after a complete reading of the present application, the portion of the layer of conductive material 114 depicted in FIG. 5 constitutes a middle-of-line (MOL) conductive line 114. In the illustrative example depicted in FIGS. 1-8, the MOL conductive line 114 is an MOL contact connection that is conductively coupled (via the first conductive cap layer 112) to one or more of the source/drain conductive contact structures 108 of one or more transistor devices formed on the IC product. However, as will be discussed more fully below in connection with FIGS. 10 and 11, the various inventions disclosed herein are not to be considered to this specific example as the novel inventions disclosed herein may be employed in many situations on an IC product and at any level of a IC product for establishing a short circuit to any of a variety of conductive structures. In the example depicted herein, the MOL conductive line 114 does not extend above the transistor 100B. However, as will be appreciated by those skilled in the art after a complete reading of the present application, in other embodiments, the MOL conductive line 114 may be positioned above both of the transistors 100A and 100B, while in yet other applications the MOL conductive line 114 may only be positioned above the transistor 100B and not above the transistor 100A.

With continued reference to FIG. 5, additional and representative insulating material 118 was formed above the product and afterward its upper surface was planarized. As before, the insulating material 118 is intended to be representative of one or more layers of insulating material that may be formed on the IC product. The insulating material(s) 118 may be comprised of a variety of materials, e.g., silicon dioxide, silicon nitride, etc., and it may be formed by performing a variety of known manufacturing techniques. The insulating material(s) 118 may be comprised of materials that are the same as or different from the insulating material(s) 110, 115, and/or 103.

Figure 6:
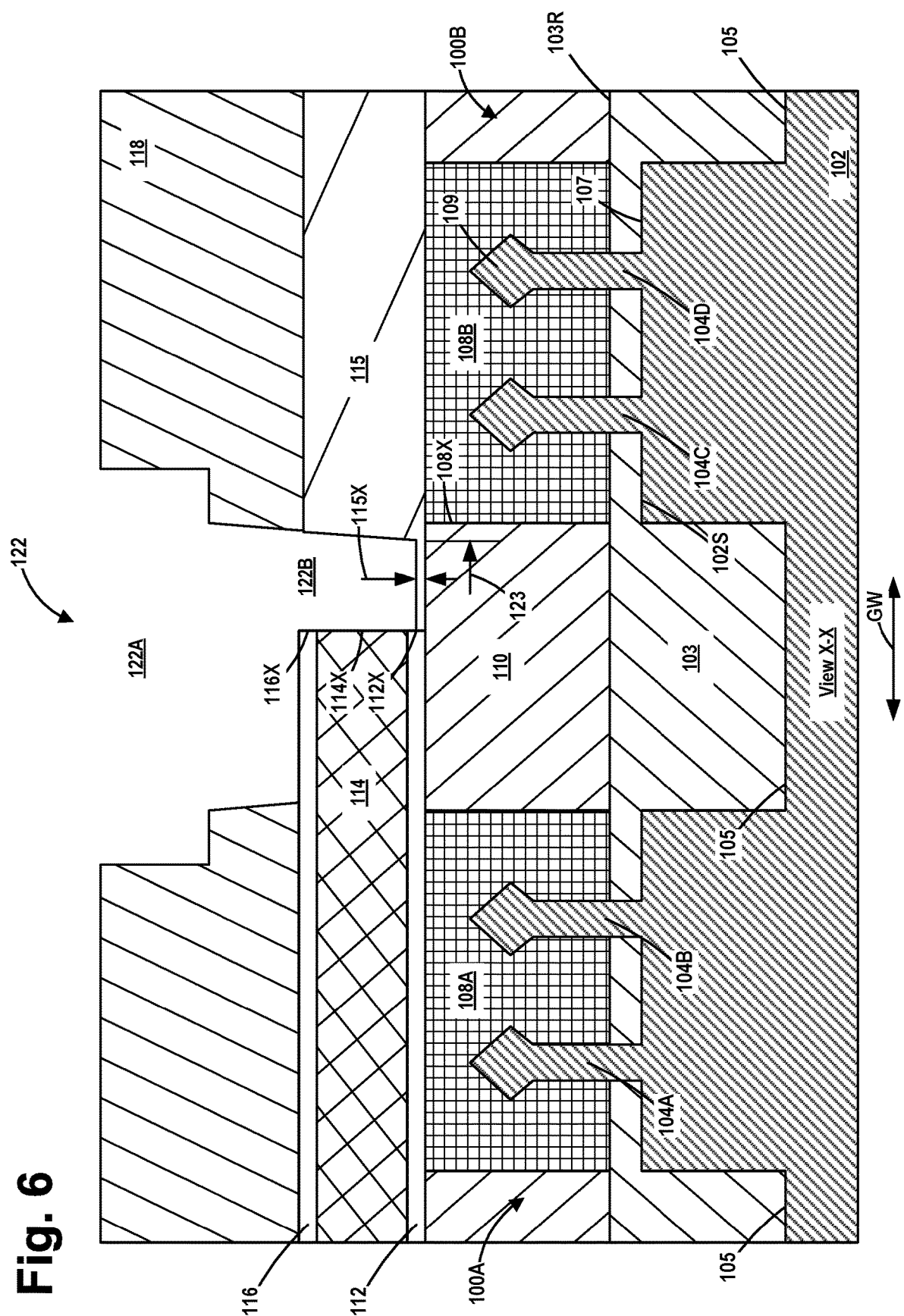

FIG. 6 depicts the IC product after several process operations were performed to form an opening 122 on the product. In the depicted example, the opening 122 comprises an illustrative trench 122A and an illustrative via 122B. As will be appreciated by those skilled in the art, the trench 122A and the via 122B may be formed using a variety of known masking and etching techniques (e.g., via first-trench last or trench first-via last). In a via first-trench last approach, the opening 122 may be formed by performing a single etching process through a single patterned etch mask. In a trench first-via last approach, the formation of the opening 122 may involve the formation two separate patterned etch masks— one to form the trench 122A and one to form the via 122B. As will be appreciated by those skilled in the art after a complete reading of the present application, the physical size, i.e., the dimension in the gate length direction, the dimension in the gate width direction and the vertical thickness of the trench 122A as well as the via 122B, may vary depending upon the particular application. In one particularly illustrative embodiment, the etching process may be performed in such a manner that the via 122B does not extend through the entire thickness of the insulating material(s) 115. For example, in one illustrative embodiment, the etching process may be performed such that there is a residual thickness 115X of the insulating material(s) 115 still positioned at the bottom of the via 122B. The magnitude of the residual thickness 115X may vary depending upon the particular application, e.g., 1-6 nm. As depicted, in one illustrative embodiment, the via 122B exposes the edge 116X of the second conductive cap layer 116, the edge 114X of the MOL conductive line 114 and at least a portion of the edge 112X of the first conductive cap layer 112.

With continued reference to FIG. 6, in this particular example, the via 122B is sized and positioned such that the portion or surface of the via 122B that is nearest the conductive source/drain contact structure 108B of the transistor 100B is laterally offset from the nearest surface of the conductive source/drain contact structure 108B. More specifically, in the example shown in FIG. 6, the portion or surface of the via 122B that is nearest the conductive source/drain contact structure 108B is laterally offset from a substantially vertically oriented edge 108X of the conductive source/drain contact structure 108B by a lateral distance 123. The lateral distance 123 is measured in a direction that is substantially parallel to an upper reference surface 102S of the substrate 102. The magnitude of the offset distance 123 may vary depending upon the particular application and the desired voltage level to be applied to create a short circuit between a conductive structure (not shown in FIG. 6) that will be formed in the via 122B and the conductive source/drain contact structure 108B. In one illustrative embodiment, based upon current day technology, the offset distance 123 may range from about 2 nm to about 6 nm.

Figure 7:
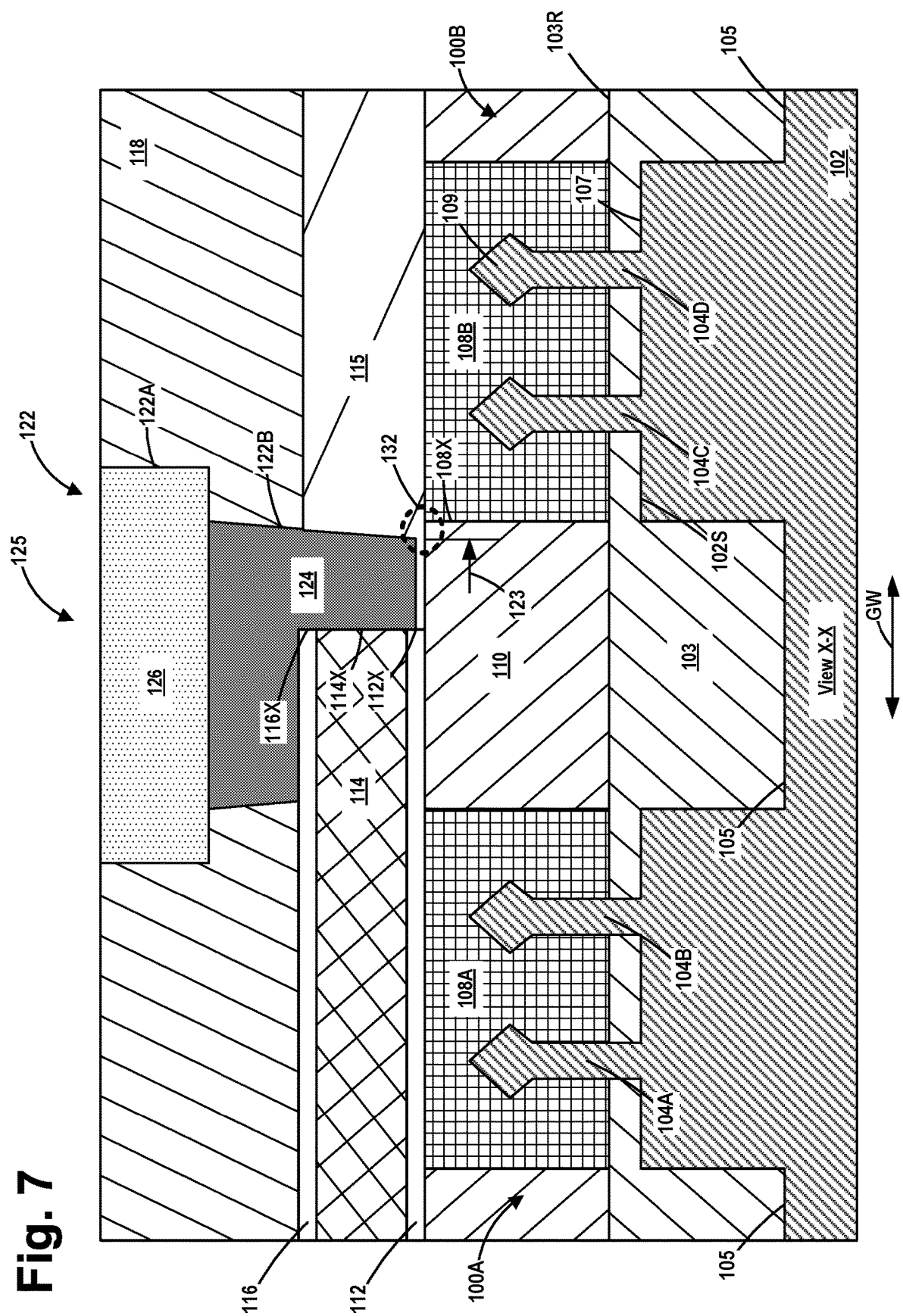

FIG. 7 depicts the IC product after several process operations were performed to form a conductive structure 125 in the opening 122. Note that the conductive structure 125 is conductively coupled to the MOL conductive line 114 and the first and second conductive cap layers 112, 116. In the depicted example, the conductive structure 125 takes the form of a conductive line 126 positioned in the trench 122A and a conductive via 124 positioned in the via 122B. The conductive via 124 and the conductive line 126 are depicted with different shading just for explanation purposes. In a real-world IC product, the conductive via 124 and the conductive line 126 would likely be a single unitary structure. In the depicted example, it is the conductive via 124 portion of the conductive structure 125 that physically contacts and engages the MOL conductive line 114. The conductive structure 125 may be comprised of any conductive material, e.g., copper, tungsten, etc., and it may comprise one or more conductive barrier or liner layers (not shown), e.g., Ti/TiN. The conductive structure 125 may be formed by performing a variety of known manufacturing techniques. In one illustrative embodiment, the conductive structure 125 may be formed by overfilling the opening 122 with conductive materials and thereafter performing one or more CMP or etch-back operations to remove any excess conductive material positioned outside of the opening 122 above the upper surface of the insulating material(s) 118. As will be appreciated by those skilled in the art, the conductive contact structure 125 could take other forms as well. Of course, the opening 122 would have a configuration that substantially corresponds to the overall configuration of the conductive structure 125.

With continued reference to FIG. 7, in the depicted example, the conductive via 124 is positioned such that the portion or surface of the conductive via 124 that is nearest the conductive source/drain contact structure 108B of the transistor 100B is laterally offset from the nearest surface of the conductive source/drain contact structure 108B by the above-described lateral distance 123. That is, nearest surfaces of the conductive structure 125 (in this case the nearest surface of the via 124) and the conductive source/drain contact structure 108B are laterally offset from one another with one or more layers or regions of insulating material, e.g., the representative insulating material 115, positioned between the nearest surfaces of the conductive structure 125 and the conductive source/drain contact structure 108B, in the dashed line region 132 in FIG. 7.

Figure 8:
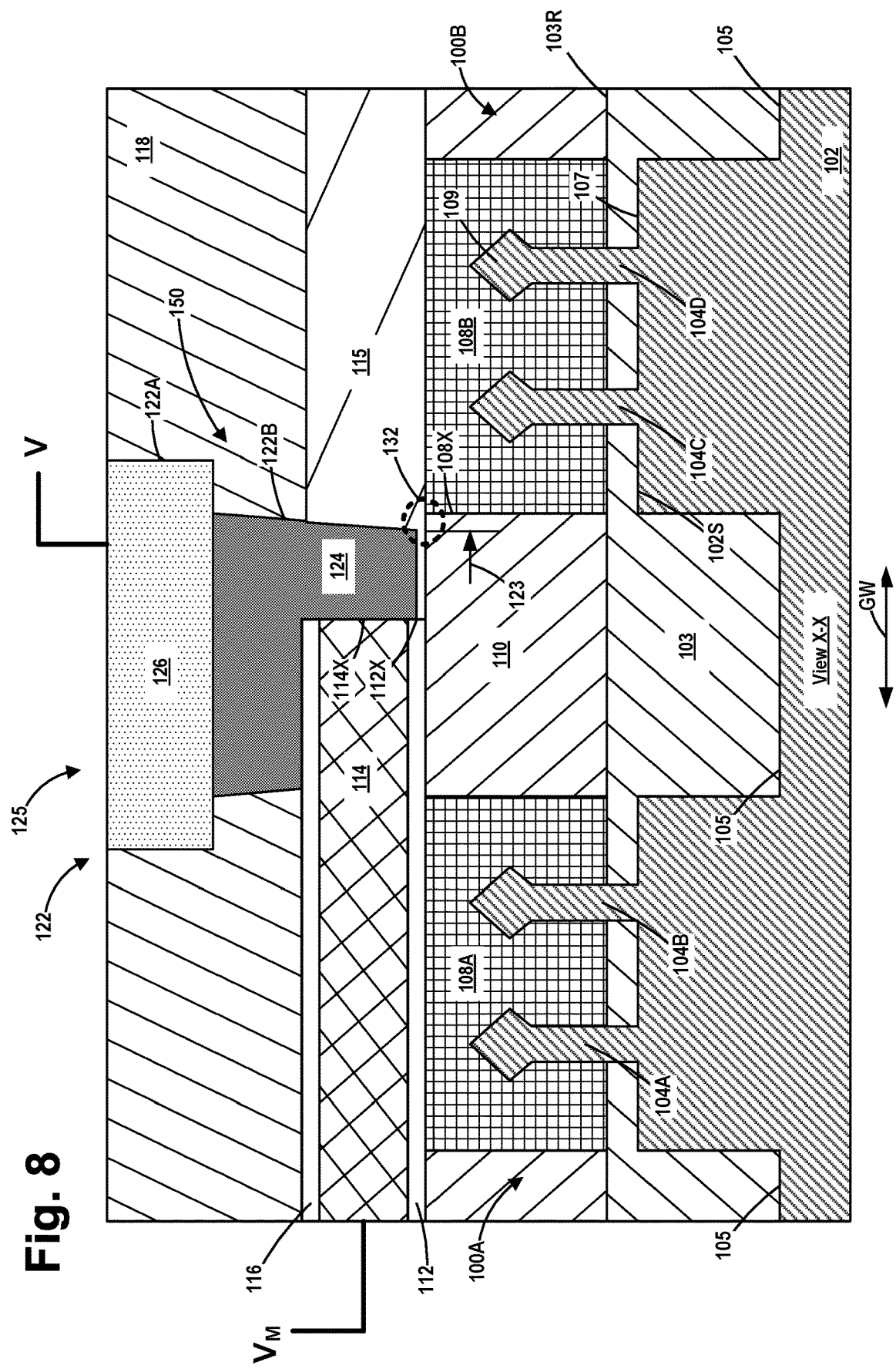

With reference to FIG. 8, during operation, a positive voltage (V) may be applied to the conductive structure 125 so as to cause the insulating material(s) in the area generally indicated by the dashed-line region 132 to break down thereby establishing a short circuit between the conductive structure 125 (and thus the MOL conductive line 114 or the conductive via 124 as well) and the conductive source/drain contact structure 108B of the transistor 100B. That is, the applied voltage (V) represents the voltage required to "blow" or activate the anti-fuse 150 and thereby establish a short circuit between the conductive structure 125 (and thus the MOL conductive line 114 or the conductive via 124 as well) and the conductive source/drain contact structure 108B of the transistor 100B. After breakdown of the insulating material(s) in the region 132, i.e., after the anti-fuse 150 is blown or activated, the voltage ($V_M$) applied to the MOL conductive line 114 will also be applied to the conductive source/drain contact structure 108B of the transistor 100B.

The magnitude of the applied voltage required to "blow" or activate the anti-fuse 150 and establish the short circuit may vary depending upon the particular application and a variety of factors. One factor that affects the magnitude of the applied voltage required to "blow" or activate the anti-fuse 150 is the composition of the insulating material(s) positioned in the region 132 between the conductive structure 125 and the conductive source/drain contact structure 108B as different insulating materials have different inherent breakdown characteristics, such as, for example, the critical field (MV/cm) value of the material, etc. Any of a variety of different insulating materials may be positioned between the conductive structure 125 and the conductive source/drain contact structure 108B of the transistor 100B, e.g., SiC, thermal $SiO_2$, deposited $SiO_2$, silicon nitride, ONO (oxide-nitride-oxide), AlN, AlO:N, $Si_xN_yO_z$, (Ba, Sr)$TiO_3$, $TiO_2$, etc.

Another factor that affects the magnitude of the applied voltage required to "blow" or activate the anti-fuse 150 is of the magnitude of the lateral offset 123 between the conductive structure 125 and the conductive source/drain contact structure 108B of the transistor 100B from the conductive source/drain contact structure 108B. In general, all other things being equal, the greater the lateral offset 123, the greater will be the applied voltage required to "blow" or activate the anti-fuse 150. Many common insulating materials (e.g., thermal $SiO_2$, deposited $SiO_2$, silicon nitride, ONO (oxide-nitride-oxide), AlN) have a critical field (MV/cm) value of about 10-12 MV/cm. Using an illustrative critical field value of about 10 MV/cm for an illustrative insulating material, if the lateral offset 123 is about 1 nm, the magnitude of the applied voltage required to "blow" or activate the anti-fuse 150 is about 1.0V. However, if the lateral offset 123 is about 2 nm, the magnitude of the applied voltage required to "blow" or activate the anti-fuse 150 is s about 2.0V. That is, a 1 nm increase in the lateral offset distance 123 increases the magnitude of the applied voltage required to "blow" or activate the anti-fuse 150 by about 1V. Depending upon the materials selected for the insulating material(s) positioned between the conductive structure 125 and the conductive source/drain contact structure 108B of the transistor 100B, this relationship between the lateral offset 123 and the magnitude of the applied voltage required to "blow" or activate the anti-fuse 150 may be substantially linear. For example, for a lateral offset distance 123 of 4 nm and 6 nm, the magnitude of the applied voltage required to "blow" or activate the anti-fuse 150 may be about 4V and 6V, respectively. Of course, this substantially linear relationship may not be true for all material combinations across all possible values for the lateral offset distance 123.

In the examples depicted above, the MOL conductive line 114 is positioned immediately above the transistor devices 100 in what may be considered to be the very first metallization layer on the IC product. In one illustrative embodiment, the conductive via 124 may be considered to be a V0 via while the conductive line 126 may be considered to be part of the M1 metallization layer. Moreover, in the depicted example, the anti-fuse 150 is adapted to be blown or activated so as to establish a short circuit between the MOL conductive line 114 and a device level contact—the conductive source/drain contact structure 108B—that is positioned in a level below the metallization level containing the MOL conductive line 114.

However, as will be appreciated by those skilled in the art after a complete reading of the present application, the novel anti-fuse 150 disclosed herein is not limited to the specific application described above. Rather, the novel anti-fuse structure 150 disclosed herein may be formed at any level above an upper surface of the substrate 102.

Figure 9:
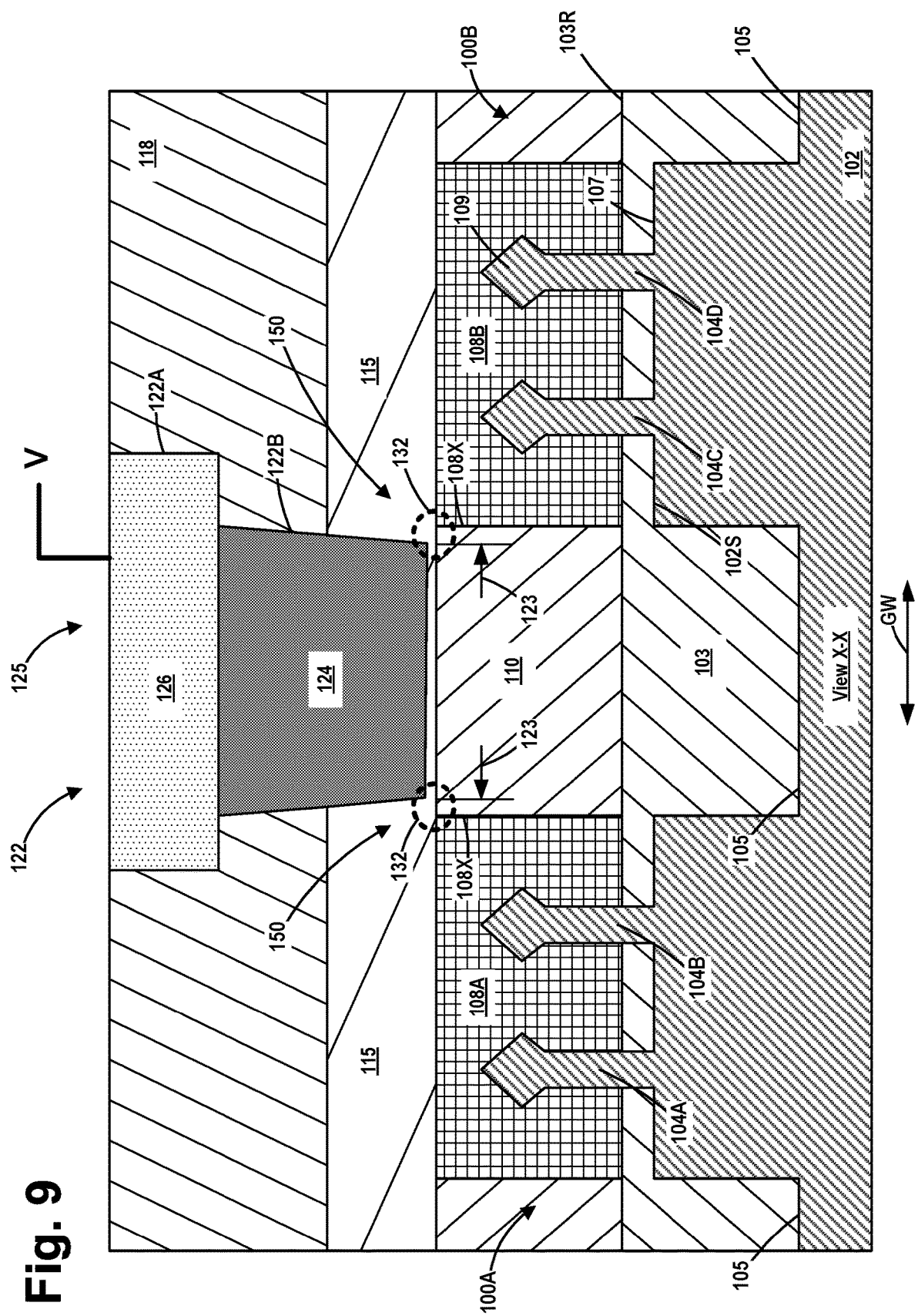

FIG. 9 depicts another illustrative example of an IC product that contains an anti-fuse 150 described herein. However, unlike the previous embodiment, in the embodiment shown in FIG. 9, the MOL conductive line 114 has been omitted. In this particular example, as before, the via 124 is sized and positioned such that the portion or surface of the via 124 nearest the conductive source/drain contact structure 108B of the transistor 100B is laterally offset from the nearest surface of the conductive source/drain contact structure 108B. However, in this case, the via 124 is sized and positioned such that the portion of the via 124 nearest the conductive source/drain contact structure 108A of the transistor 100A is laterally offset from the conductive source/drain contact structure 108A. More specifically, in the example shown in FIG. 9, the surface of the via 124 that is nearest the conductive source/drain contact structure 108B is laterally offset from a substantially vertically oriented edge 108X of the conductive source/drain contact structure 108B by the above-described lateral distance 123. Similarly, the portion of the via 124 that is nearest the conductive source/drain contact structure 108A of the transistor 100A is laterally offset from a substantially vertically oriented edge 108X of the conductive source/drain contact structure 108A by the same lateral distance 123. In this embodiment, the above-described voltage V may be applied to the conductive structure 125 so as to cause breakdown of the insulating material(s) in the two areas 132 thereby establishing a short circuit between the conductive structure 125 and the conductive source/drain contact structures 108A, 108B of the transistors 100A, 100B, respectively. After breakdown of the insulating material(s) in the two regions 132, i.e., after the anti-fuse 150 is blown or activated, the voltage (V) applied to the conductive structure 125 will also be applied to the conductive source/drain contact structures 108A and 108B.

Figure 10:
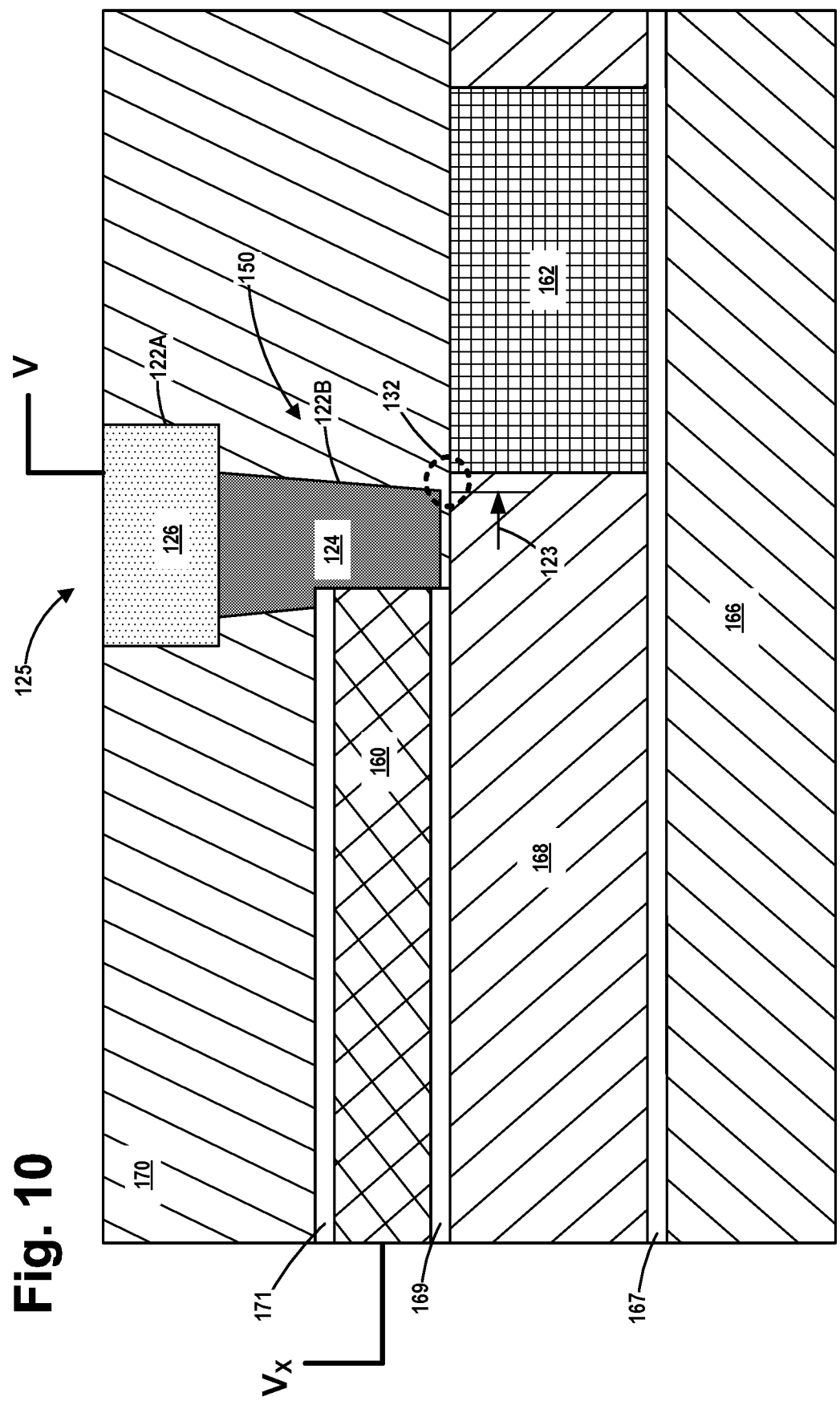

FIG. 10 depicts a more generic embodiment of the anti-fuse 150 wherein the MOL conductive line 114 has been replaced with a first conductive line 160 and the conductive source/drain contact structure 108B of the transistor 100B has been replaced with a generic conductive structure 162. The conductive structure 162 is intended to be representative in nature as it may take any form or configuration and it may serve any purpose. For example, in one illustrative embodiment, the conductive structure 162 may take the form of a conductive line positioned in a trench, a conductive via, a conductive part of a memory cell, a conductive part of a capacitor, polysilicon, etc. The conductive structure 162 may be positioned at any level in the IC product. Also depicted in FIG. 10 are various representative layers of insulating material(s) 166, 168 and 170, as well as a plurality of representative conductive cap layers 169 and 171. An etch stop layer 167 is also depicted in FIG. 10 and it may be conductive or non-conductive depending upon the particular application. As depicted, the first conductive line 160 is positioned at a first level above the substrate within the IC product and the conductive structure 162 is positioned within the IC product at a second level above the substrate, wherein the second level is below the first level where the first conductive line 160 is positioned. Additionally, the above-described conductive structure 125 extends vertically through at least a portion of the insulating material(s) 170 positioned at level that is above the first level that contains the first conductive line 160 and it is conductively coupled to the first conductive line 160.

As before, the conductive structure 125 is laterally offset from the nearest part or surface of the conductive structure 162 by the above-described lateral distance 123. As with the previous embodiments, during operation, the voltage (V) may be applied to the conductive structure 125 so as to cause the insulating material(s) in the area generally indicated by the dashed-line region 132 to break down thereby establishing a short circuit between the conductive structure 125 (and thus the first conductive line 160 or the conductive via 124 as well) and the conductive structure 162. As before, after breakdown of the insulating material(s) in the region 132, i.e., after the anti-fuse 150 is blown or activated, the voltage $(V_x)$ applied to the first conductive line 160 will also be applied to the conductive structure 162.

Figure 11:
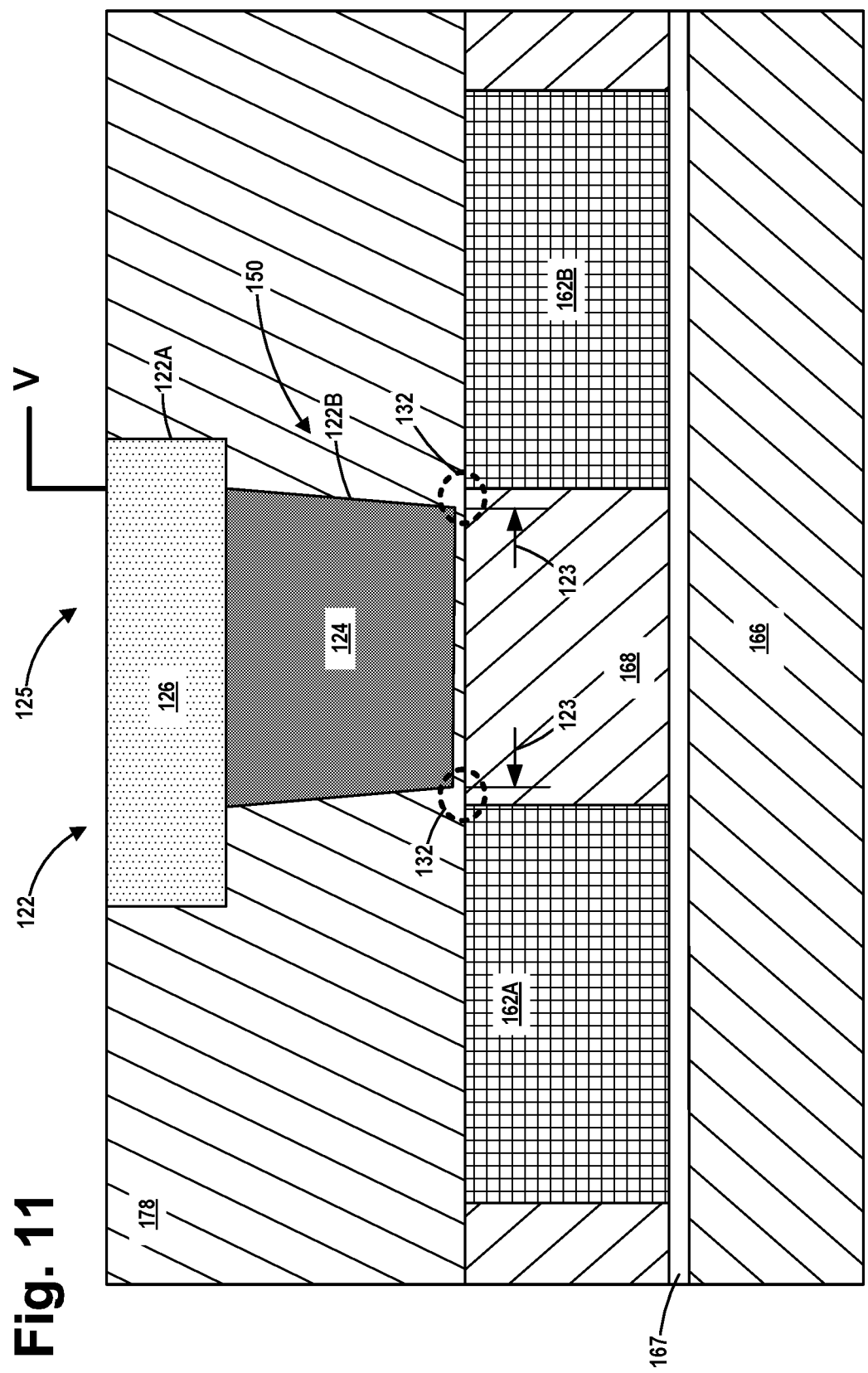

FIG. 11 depicts yet another illustrative embodiment of an IC product that contains an anti-fuse 150 described herein that may be positioned at any level within an IC product. However, unlike the previous embodiment shown in FIG. 10, in the embodiment shown in FIG. 11, the first conductive line 160 has been omitted as has the conductive cap layers 169 and 171. Also depicted in FIG. 11 are two of the above-described generic conductive structure 162A, 162B (collectively referenced using the numeral 162). Of course, in some applications, only a single generic conductive structure 162 may be formed proximate the conductive structure 125 shown in FIG. 11. In this particular example, the via 124 is sized and positioned such that the portion or surface of the via 124 that is nearest the generic conductive structure 162A is laterally offset from the nearest surface of the generic conductive structure 162A. Additionally, in this case, the via 124 is sized and positioned such that the portion of the via 124 nearest the generic conductive structure 162B is also laterally offset from the nearest surface of the generic conductive structure 162B. More specifically, in the example shown in FIG. 11, the surface of the via 124 that is nearest the generic conductive structure 162A is laterally offset from a substantially vertically oriented edge of the generic conductive structure 162A by the above-described lateral distance 123. Similarly, the portion or surface of the via 124 that is nearest the generic conductive structure 162B is laterally offset from a substantially vertically oriented edge of the generic conductive structure 162B by the same lateral distance 123. In this embodiment, the above-described voltage V may be applied to the conductive structure 125 so as to cause breakdown of the insulating material(s) in the two areas 132 thereby establishing a short circuit between the conductive structure 125 and the generic conductive structure 162A, 162B. After breakdown of the insulating material(s) in the two regions 132, i.e., after the anti-fuse 150 is blown or activated, the voltage (V) applied to the conductive structure 125 will also be applied to the generic conductive structure 162A and 162B.

FIGS. 12-15 depict plan views of one illustrative layout of an IC product that comprises a plurality of anti-fuse structures disclosed herein. FIGS. 12-15 depict the formation of the major components discussed above but they do not include all of the details shown in the cross-sectional drawings above.

Figure 12:
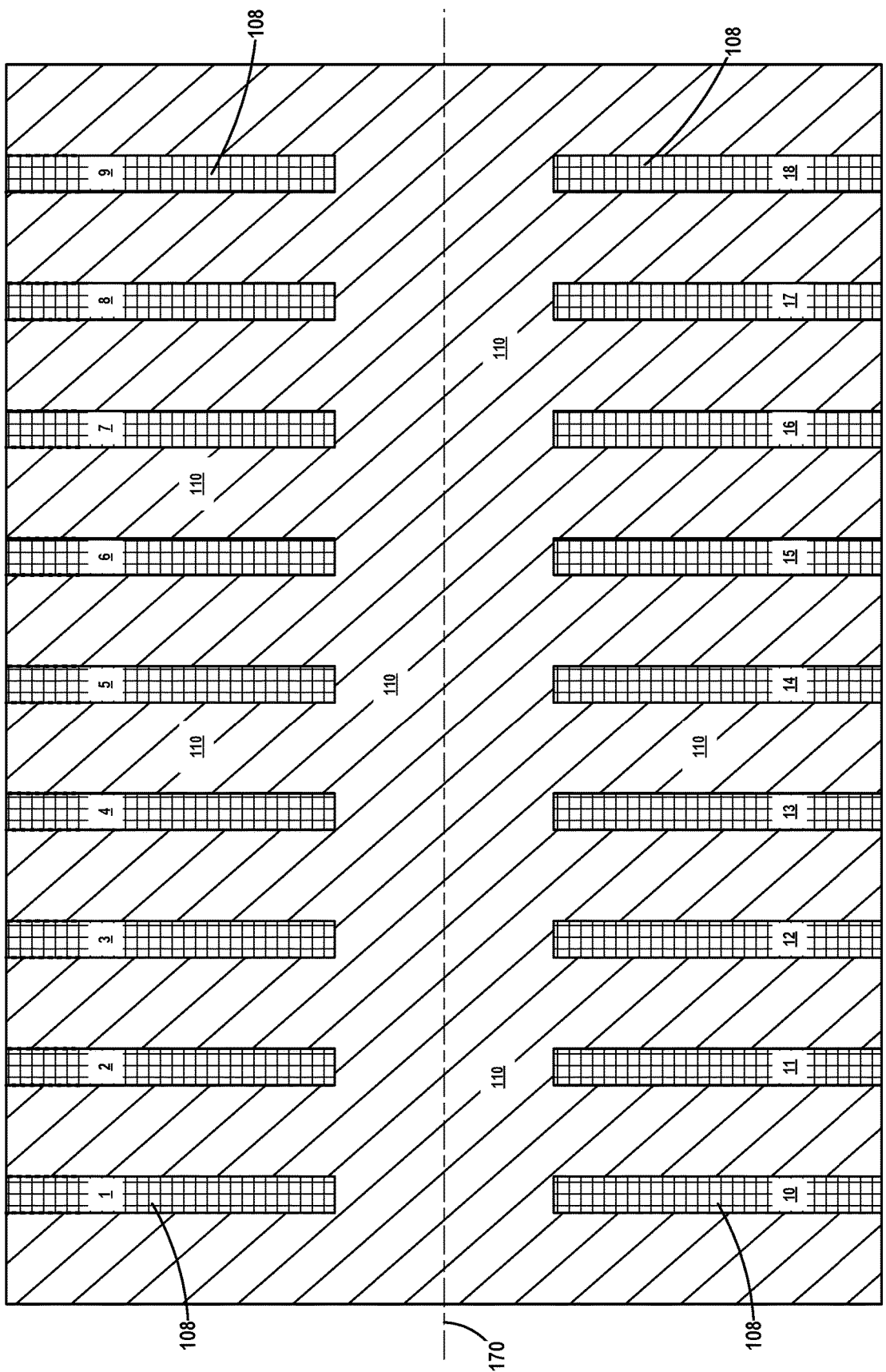
FIGS. 12-15 depict plan views of one illustrative layout of an IC product that comprises a plurality of anti-fuse structures disclosed herein.

FIG. 12 depicts the IC product after a plurality of transistor devices (not shown) have been formed above the substrate 102 and after a plurality of conductive source/drain contact structures 108 have been formed for each of the transistor devices. Also depicted in FIG. 12 is the above-described insulating material 110 (the other insulating materials and conductive cap layers are not shown in the plan drawings so as to not obscure the present inventions). The horizontal centerline 170 of the this particular layout is depicted in FIG. 12. As will be appreciated by those skilled in the art, a first plurality of transistor devices (not shown) were formed above the centerline 170 while a second plurality of transistor devices (not shown) were formed below the centerline 170. One of the above-described conductive source/drain contact structures 108 is positioned above each of the source/drain regions of the transistor devices. In the illustrative example depicted in FIG. 12, there are nine transistor devices formed above the centerline 170 and nine transistor devices formed below the centerline 170. One of the source/drain regions for each of the nine transistor devices formed above the centerline 170 has been labeled with the numbers 1-9 for reference purposes. One of the source/drain regions of each of the nine transistor devices formed below the centerline 170 has been labeled with the numbers 10-18 for reference purposes.

Figure 13:
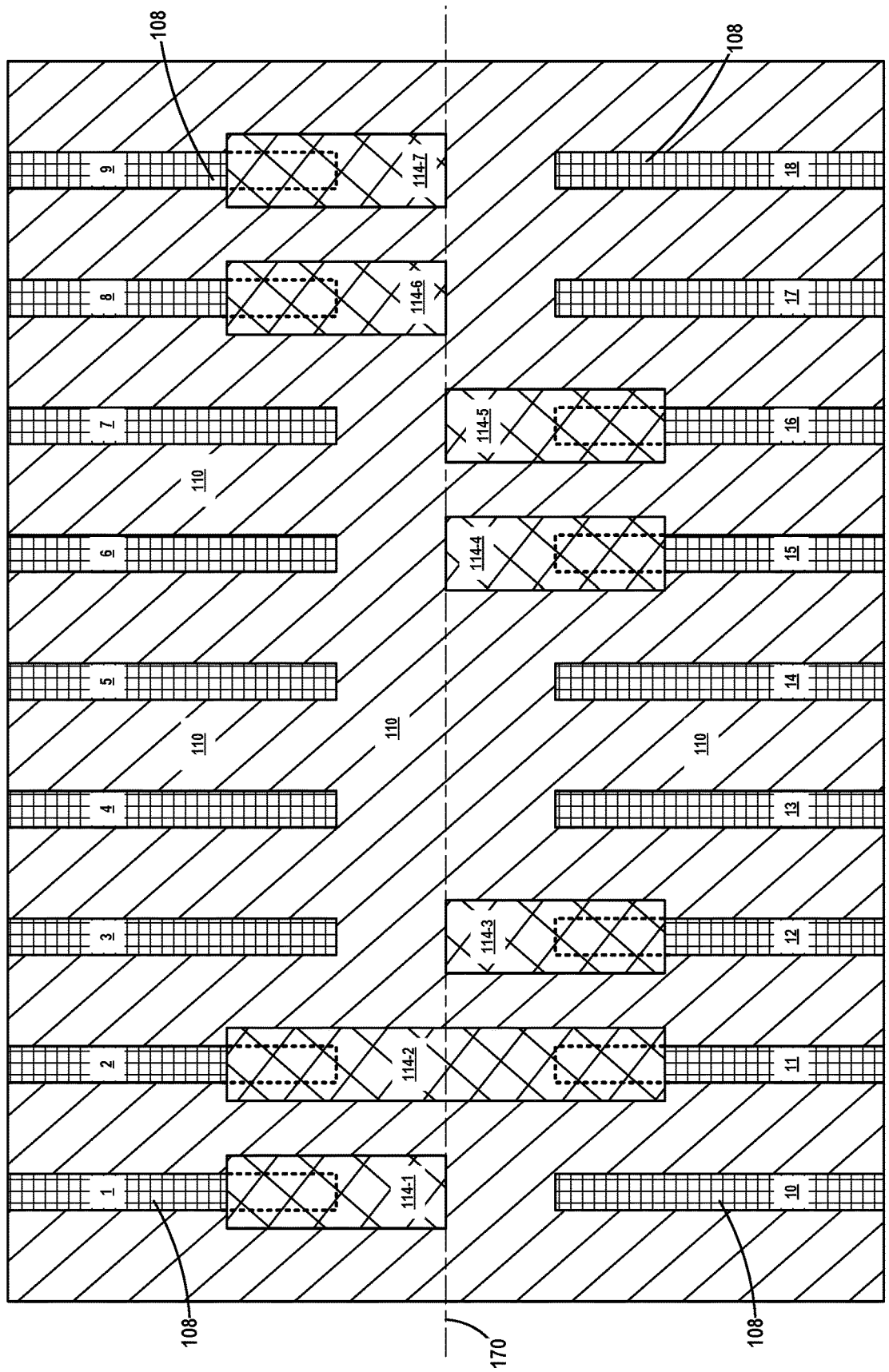

FIG. 13 depicts the IC product after the formation of a plurality of the above-described MOL conductive lines 114. More specifically, seven of the illustrative MOL conductive lines 114 (labeled 114-1 through 114-7 for reference purposes) were formed on the IC product. As depicted, the MOL conductive lines 114 are positioned above and conductively coupled to certain of the conductive source/drain contact structures 108 via the first conductive cap layer 112 (see FIG. 8). It should be noted that the MOL conductive line 114-2 is positioned above and conductively coupled to the conductive source/drain contact structure 2 as well the conductive source/drain contact structure 11. As will be appreciated by those skilled in the art after a complete reading of the present application, the MOL conductive lines 114 may be positioned symmetrically or asymmetrically relative to the overall layout of the IC product. For example, the MOL conductive lines 114-4 and 114-5 and the MOL conductive lines 114-6 and 114-7 are positioned symmetrically relative to the centerline 170. On the other hand, the MOL conductive lines 114-1, 114-2 and 114-3 are positioned asymmetrically relative to one another and the centerline 170.

Figure 14:
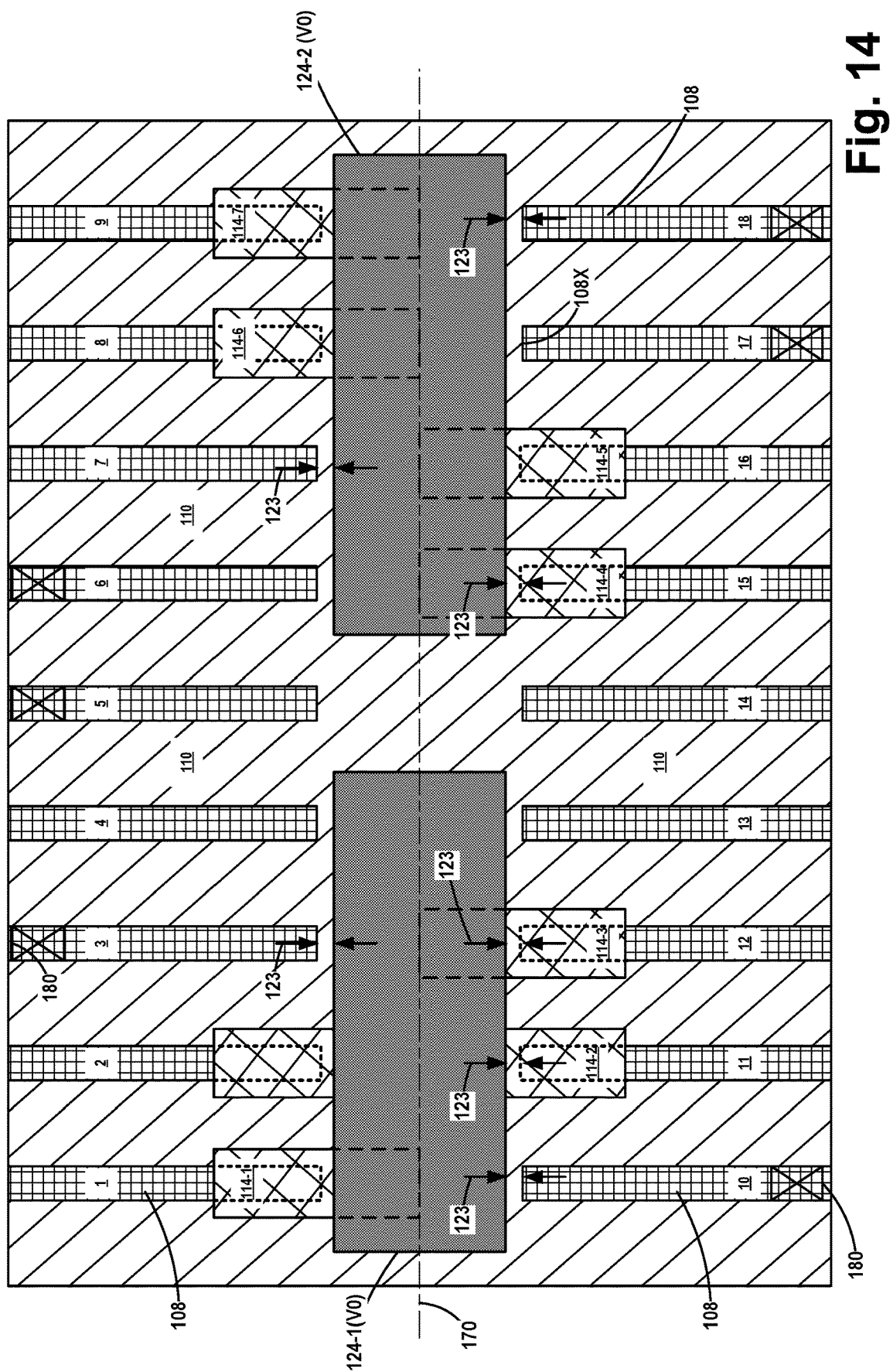

As noted above, the conductive via 124 and the conductive line 126 may be formed at the same time and be part of a continuous conductive structure 125. Nevertheless, FIG. 14 depicts the formation of just the conductive via 124 for purposes of explanation only. More specifically, FIG. 14 depicts the formation of two separate conductive vias 124-1 and 124-2 (collectively referenced using the numeral 124). It should be noted that an edge surface 108X of each of the conductive source/drain contact structures 108 is laterally offset from the edge of each of the conductive vias 124-1 and 124-2 by the above-described lateral offset distance 123. As depicted, the conductive vias 124 are positioned vertically above portions of the MOL conductive lines 114 and separated therefrom by the second conductive cap layer 116 (not shown). Also depicted in FIG. 14 are various illustrative conductive vias 180 that are formed to contact certain of the conductive source/drain contact structures 108. The conductive vias 180 are intended to be representative of traditional conductive vias that are formed on IC products using traditional manufacturing techniques.

Figure 15:
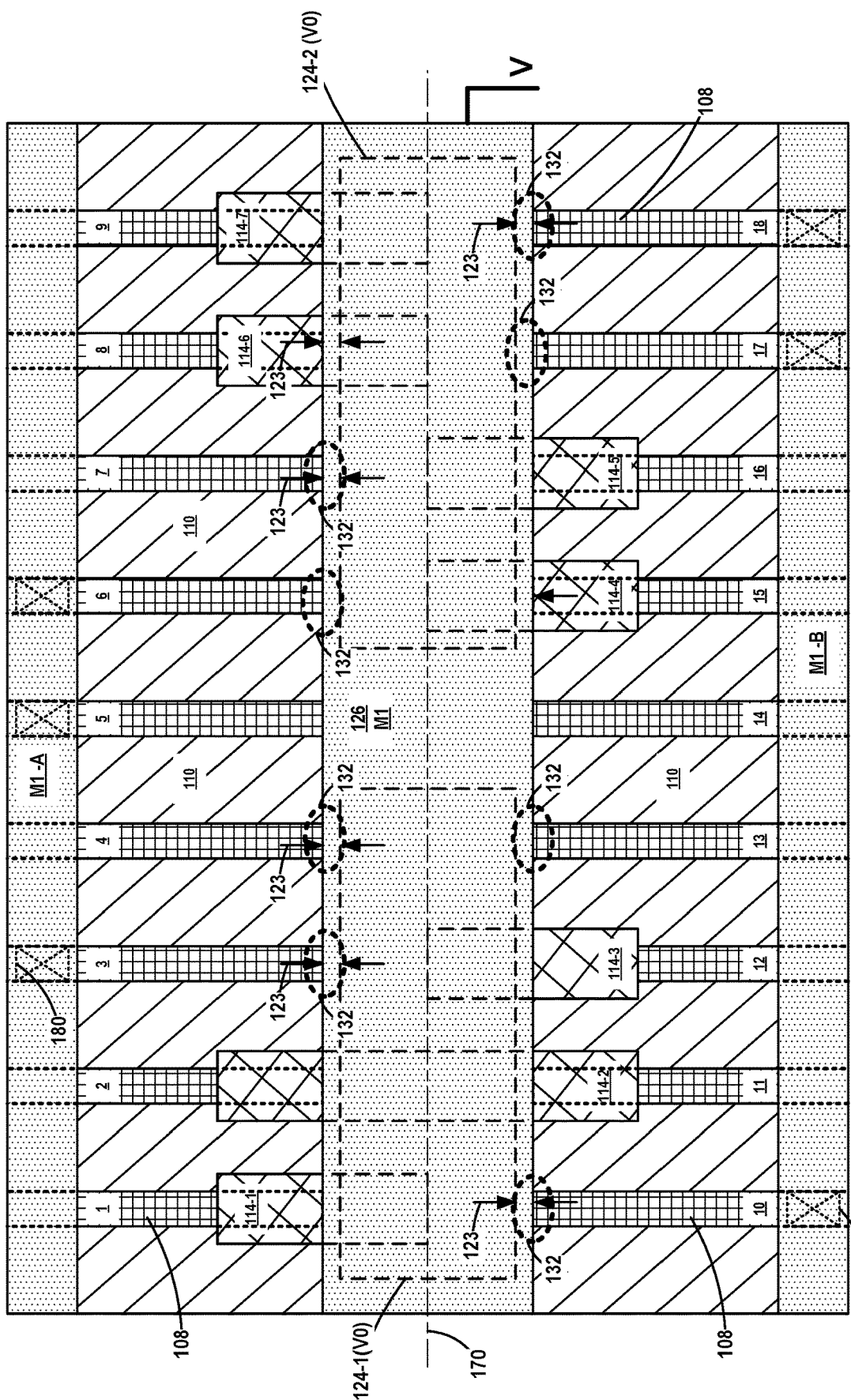

FIG. 15 depicts the product after various lines in the M1 metallization layer of the IC product were formed. More specifically, FIG. 15 depicts the formation of representative M1 lines M1-A and M1-B that may be conductively coupled to one or more of the conductive source/drain contact structures 108 underlying each line by one or more of the illustrative conductive vias 180. Also depicted in FIG. 15 is the above-described conductive line portion 126 of the conductive structure 125 that is conductively coupled to the two separate conductive vias 124-1 and 124-2. The conductive vias 124-1 and 124-2 are shown in dashed lines in FIG. 15. The symmetric coupling positioning along the center line 170 makes the anti-fuse design substantially independent of process variations, such as CD, overlay, etc.

As noted above, the above-described voltage (V) may be applied to the conductive structure 125, e.g., the conductive line 126 and the two conductive vias 124-1 and 124-2, so as to cause the insulating material(s) in the areas generally indicated by the dashed-line region 132 to break down thereby establishing a short circuit between the conductive structure 125 and the immediately adjacent conductive source/drain contact structure 108. A relatively lower voltage may be applied to the conductive lines M1-A and M1-B. More specifically, application of the appropriate voltage (V) to the conductive line 126 establishes a short circuit between the conductive source/drain contact structure 10 and the MOL conductive line 114-1, between the conductive source/drain contact structure 3 and the MOL conductive line 114-3, between the conductive source/drain contact structures 4 and 13 and the conductive via 124-1, between the conductive source/drain contact structure 6 and the MOL conductive line 114-4, between the conductive source/drain contact structure 7 and the MOL conductive line 114-5, between the conductive source/drain contact structure 17 and the MOL conductive line 114-6 and between the conductive source/drain contact structure 18 and the MOL conductive line 114-7.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. An integrated circuit product, comprising:
a first conductive line positioned at a first level within the integrated circuit product;
a first conductive structure positioned at a second level within the integrated circuit product, wherein the second level is lower than the first level;
a second conductive structure that is conductively coupled to the first conductive line, wherein at least a portion of the second conductive structure is positioned at a level that is above the first level and wherein nearest surfaces of the first conductive structure and the second conductive structure are laterally offset from one another by a lateral distance; and
insulating material positioned between the nearest surfaces of the first conductive structure and the second conductive structure.

2. The integrated circuit product of claim 1, wherein the first conductive line is an M0 contact connection, the first conductive structure is a conductive source/drain contact structure of a transistor device and wherein the second conductive contact structure comprises a conductive line in an M1 metallization layer and a conductive via that is a conductive V0 via, wherein the conductive V0 via contacts and physically engages the M0 contact connection.

3. The integrated circuit product of claim 1, wherein the lateral distance falls within a range of about 2 nm to 6 nm.

4. The integrated circuit product of claim 1, further comprising a semiconductor substrate having an upper surface, wherein the first conductive line is positioned above the upper surface of the semiconductor substrate and wherein the lateral distance extends in a direction that is substantially parallel to the upper surface of the semiconductor substrate.

5. The integrated circuit product of claim 1, further comprising at least one layer of insulating material positioned above the first conductive line, wherein the second conductive structure is at least partially positioned in the at least one layer of insulating material positioned above the first conductive line.

6. The integrated circuit product of claim 1, wherein the insulating material positioned between the nearest surfaces of the first conductive structure and the second conductive structure is adapted to break down upon application of an appropriate voltage to the second conductive structure so as to thereby establish a short circuit between the first conductive line and the first conductive structure.

7. The integrated circuit product of claim 1, wherein the first conductive line is positioned in an M3 metallization layer of the IC product and the first conducive structure is positioned in an M2 metallization layer of the IC product.

8. The integrated circuit product of claim 1, wherein the first conductive structure comprises one of a conductive source/drain contact structure of a transistor device, a conductive line, a conductive via, a conductive part of a memory cell or a conductive part of a capacitor.

9. The integrated circuit product of claim 1, wherein the first conductive line is positioned above and conductively coupled to a first conductive source/drain contact structure of a first transistor device and wherein the first conductive structure is a second conductive source/drain contact structure of a second transistor device.

10. The integrated circuit product of claim 1, further comprising a first conductive cap layer and a second conductive cap layer, wherein a lower surface of the first conductive line is positioned on and in contact with the first conductive cap layer and the second conductive cap layer is positioned on and in contact with an upper surface of the first conductive line.

11. The integrated circuit product of claim 2, wherein the M0 contact connection comprises one of copper or tungsten, the conductive source/drain contact structure comprises a trench silicide, the conductive line in the M1 metallization layer comprises one of copper or tungsten and the conductive V0 via comprises one of copper or tungsten.

12. An integrated circuit product, comprising:
a semiconductor substrate having an upper surface;
a first conductive line positioned above the upper surface of the semiconductor substrate, wherein the first conductive line is positioned at a first level within the integrated circuit product;
a first conductive structure positioned at a second level within the integrated circuit product, wherein the second level is lower than the first level;
a second conductive structure that is conductively coupled to the first conductive line, wherein at least a portion of the second conductive structure is positioned at a level that is above the first level and wherein nearest surfaces of the first conductive structure and the second conductive structure are laterally offset from one another by a lateral distance that falls within a range of about 2 nm to 6 nm, wherein the lateral distance extends in a direction that is substantially parallel to the upper surface of the semiconductor substrate; and
insulating material positioned between the nearest surfaces of the first conductive structure and the second conductive structure.

13. The integrated circuit product of claim 12, further comprising at least one layer of insulating material positioned above the first conductive line, wherein the second conductive structure is at least partially positioned in the at least one layer of insulating material positioned above the first conductive line.

14. The integrated circuit product of claim 12, wherein the insulating material positioned between the nearest surfaces of the first conductive structure and the second conductive structure is adapted to break down upon application of an appropriate voltage to the second conductive structure so as to thereby establish a short circuit between the second conductive structure and the first conductive structure.

15. The integrated circuit product of claim 12, wherein the first conductive line is positioned above and conductively coupled to a first conductive source/drain contact structure of a first transistor device and wherein the second conductive structure is a second conductive source/drain contact structure of a second transistor device.

16. The integrated circuit product of claim 12, further comprising a first conductive cap layer and a second conductive cap layer, wherein a lower surface of the first conductive line is positioned on and in contact with the first conductive cap layer and the second conductive cap layer is positioned on and in contact with an upper surface of the first conductive line.

17. An integrated circuit product, comprising:
a semiconductor substrate having an upper surface;
a first transistor device comprising a first conductive source/drain contact structure of a first transistor device;
an M0 contact connection positioned above and conductively coupled to the first conductive source/drain contact structure, wherein the M0 contact connection is positioned at a first level within the integrated circuit product
a second transistor device comprising a second conductive source/drain contact structure, wherein the second conductive source/drain contact structure is positioned at a second level within the integrated circuit product that is lower than the first level;
a first conductive structure that is conductively coupled to the M0 contact connection, wherein at least a portion of the first conductive structure is positioned at a level that is above the first level and wherein nearest surfaces of the first conductive structure and the second conductive source/drain contact structure are laterally offset from one another by a lateral distance; and
insulating material positioned between the nearest surfaces of the M0 contact connection and the second conductive source/drain contact structure.

18. The integrated circuit product of claim 17, wherein the lateral distance falls within a range of about 2 nm to 6 nm, wherein the lateral distance extends in a direction that is substantially parallel to the upper surface of the semiconductor substrate.

19. The integrated circuit product of claim 17, wherein the insulating material positioned between the nearest surfaces of the first conductive structure and the second conductive source/drain contact structure is adapted to break down upon application of an appropriate voltage to the first conductive structure so as to thereby establish a short circuit between the first conductive structure and the second conductive source/drain contact structure.

20. The integrated circuit product of claim 17, further comprising a first conductive cap layer and a second conductive cap layer, wherein a lower surface of the M0 contact connection is positioned on and in contact with the first conductive cap layer and the second conductive cap layer is positioned on and in contact with an upper surface of the M0 contact connection.

* * * * *